United States Patent [19]

Tarzwell et al.

[11] Patent Number: 5,066,907
[45] Date of Patent: Nov. 19, 1991

[54] PROBE SYSTEM FOR DEVICE AND CIRCUIT TESTING

[75] Inventors: John W. Tarzwell, Scottsdale; Patrick J. Tarzwell, Mesa; Theodore R. Myers, Tempe; Barry M. Hyland, Scottsdale; John C. Dahl, Mesa; Jack L. Eddings, Scottsdale, all of Ariz.

[73] Assignee: Cerprobe Corporation, Tempe, Ariz.

[21] Appl. No.: 475,820

[22] Filed: Feb. 6, 1990

[51] Int. Cl.$^5$ ................... G01R 1/06; G01R 31/02
[52] U.S. Cl. ........................... 324/158 P; 324/72.5; 324/158 F
[58] Field of Search ............ 324/158 P, 158 F, 72.5, 324/73.1

[56] References Cited

U.S. PATENT DOCUMENTS

| | | | |
|---|---|---|---|
| 3,411,125 | 11/1968 | Hill | 339/12 |
| 3,731,191 | 5/1973 | Bullard et al. | 324/158 |
| 3,781,681 | 12/1973 | Wagner et al. | 324/158 |
| 3,835,381 | 9/1974 | Garretson et al. | 324/158 |
| 3,905,098 | 9/1975 | Garretson et al. | 29/628 |
| 3,944,922 | 3/1976 | Chambers et al. | 324/158 |
| 3,952,410 | 4/1976 | Garretson et al. | 29/628 |
| 4,035,723 | 7/1977 | Kvaternik | 324/158 |
| 4,045,737 | 8/1977 | Coberly | 324/158 |
| 4,099,119 | 7/1978 | Goetz | 324/73 |
| 4,116,523 | 9/1978 | Coberly et al. | 339/108 |
| 4,123,706 | 10/1978 | Roch | 324/158 |
| 4,151,465 | 4/1979 | Lenz | 324/158 |
| 4,161,692 | 7/1979 | Tarzwell | 324/158 |
| 4,164,704 | 8/1979 | Kato et al. | 324/73 |
| 4,177,425 | 12/1979 | Lenz | 324/158 |
| 4,267,506 | 5/1981 | Shiell | 324/158 |
| 4,321,532 | 3/1982 | Luna | 324/158 |
| 4,476,433 | 10/1984 | Logan | 324/158 |
| 4,480,223 | 10/1984 | Aigo | 324/158 |
| 4,523,144 | 6/1985 | Okubo et al. | 324/158 |
| 4,593,243 | 6/1986 | Lao et al. | 324/158 |
| 4,623,839 | 11/1986 | Garretson et al. | 324/158 |
| 4,636,722 | 1/1987 | Ardezzone | 324/158 P |
| 4,649,339 | 3/1987 | Grangroth et al. | 324/158 F |
| 4,812,745 | 3/1989 | Kern | 324/158 |
| 4,827,211 | 5/1989 | Strid et al. | 324/158 |
| 4,847,553 | 7/1989 | Seinecke | 324/158 |

FOREIGN PATENT DOCUMENTS 0304868 3/1989 European Pat. Off. ........ 324/158 P

OTHER PUBLICATIONS

IBM Technical Disclosure Bulletin, vol. 14, No. 2, Jul. 1971, p. 568.

Primary Examiner—Ernest F. Karlsen
Attorney, Agent, or Firm—Cahill, Sutton & Thomas

[57] ABSTRACT

A probe assembly is described for providing temporary connection to electrical circuits under test such as integrated circuits and the like. Individual probes are formed of suitable metal and are provided with a 90° bend to create a depending portion for contact with a pad of a circuit under test and to form a supported length extending along a slot formed in the surface of a probe guide. The slot in the probe guide terminates at a hole for receiving the depending portion of the probe; the probe is supported by and positioned by the probe guide within the slot and hole provided therefore; an elastomeric pad is placed over a portion of the probe in the slot and a pressure plate urges the elastomer into contact with the probe to provide biasing force to urge the probe to extend through the probe guide hole into contact with the pad of the circuit under test. The pressure plate may contain signal traces for connection to the supported length of the probe to permit signals to be communicated from the probe tip in contact with the pad to a location remote from the probe.

7 Claims, 3 Drawing Sheets

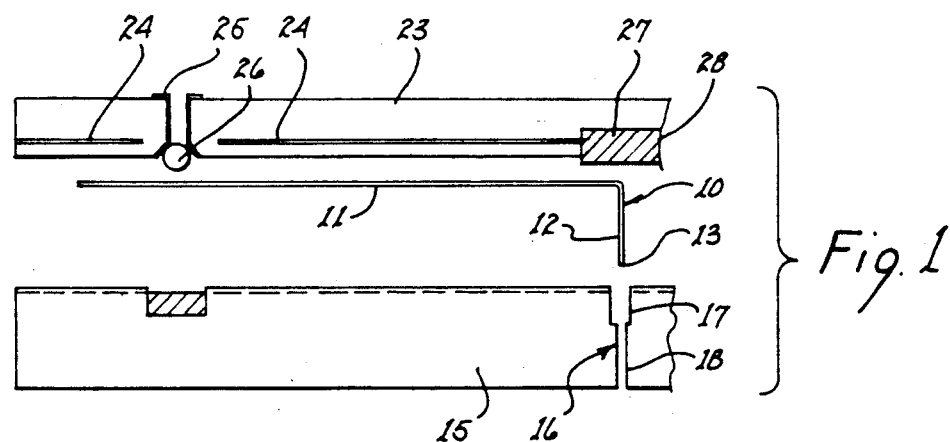
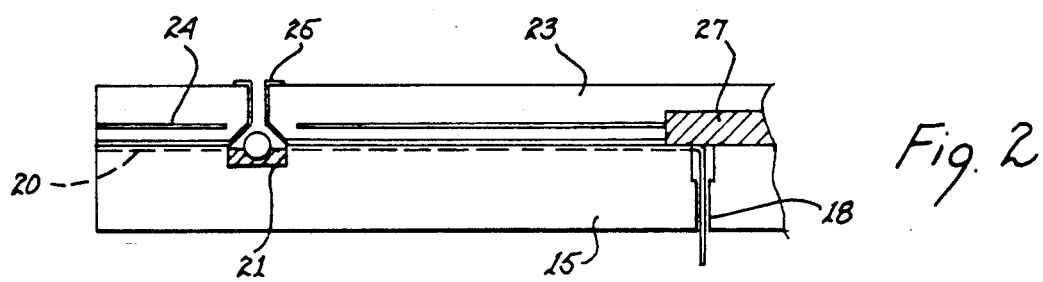
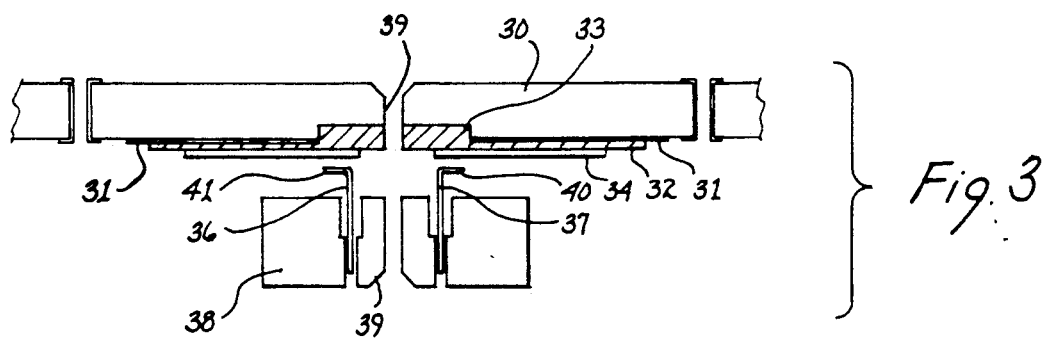
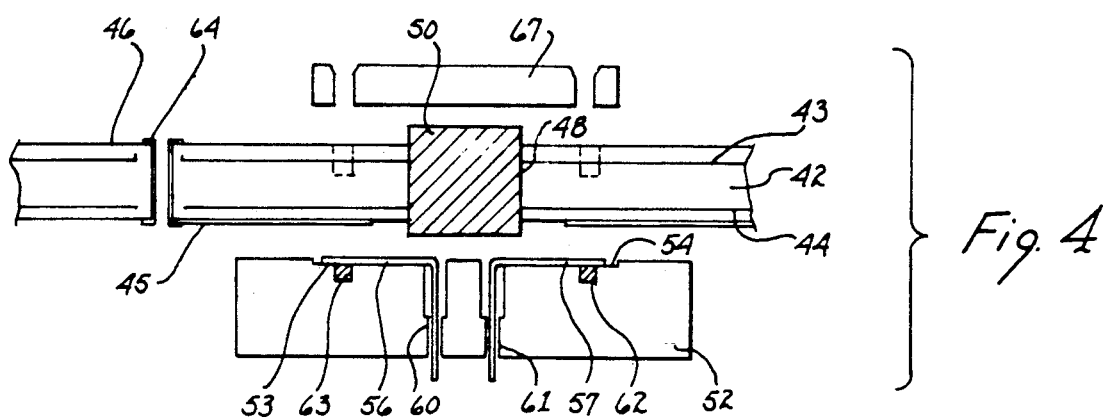

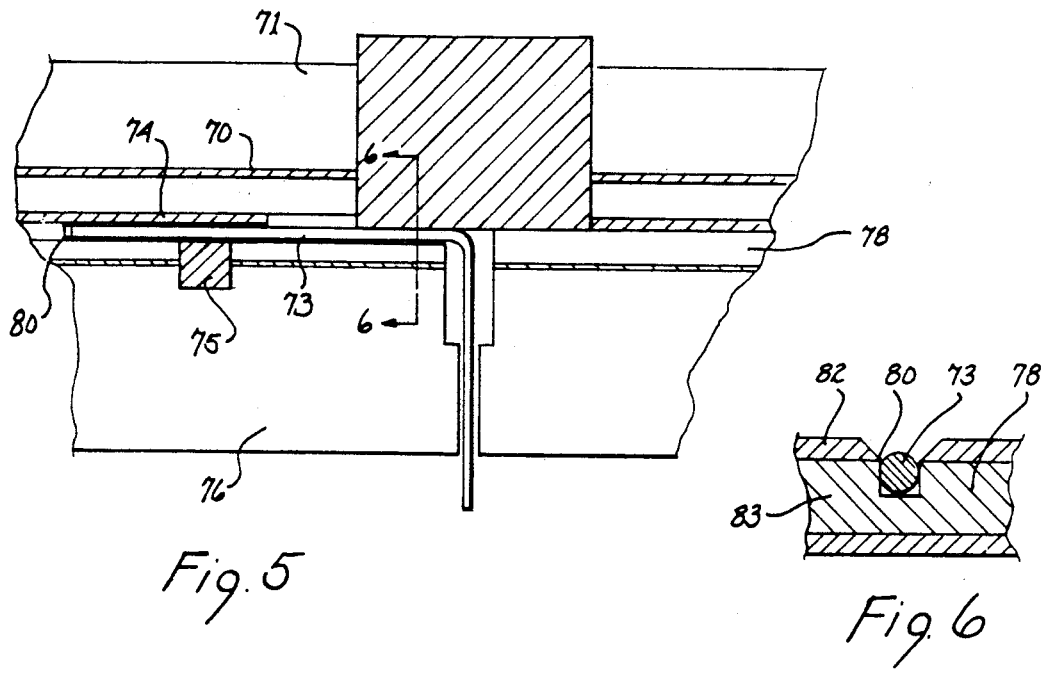
Fig. 5
Fig. 6
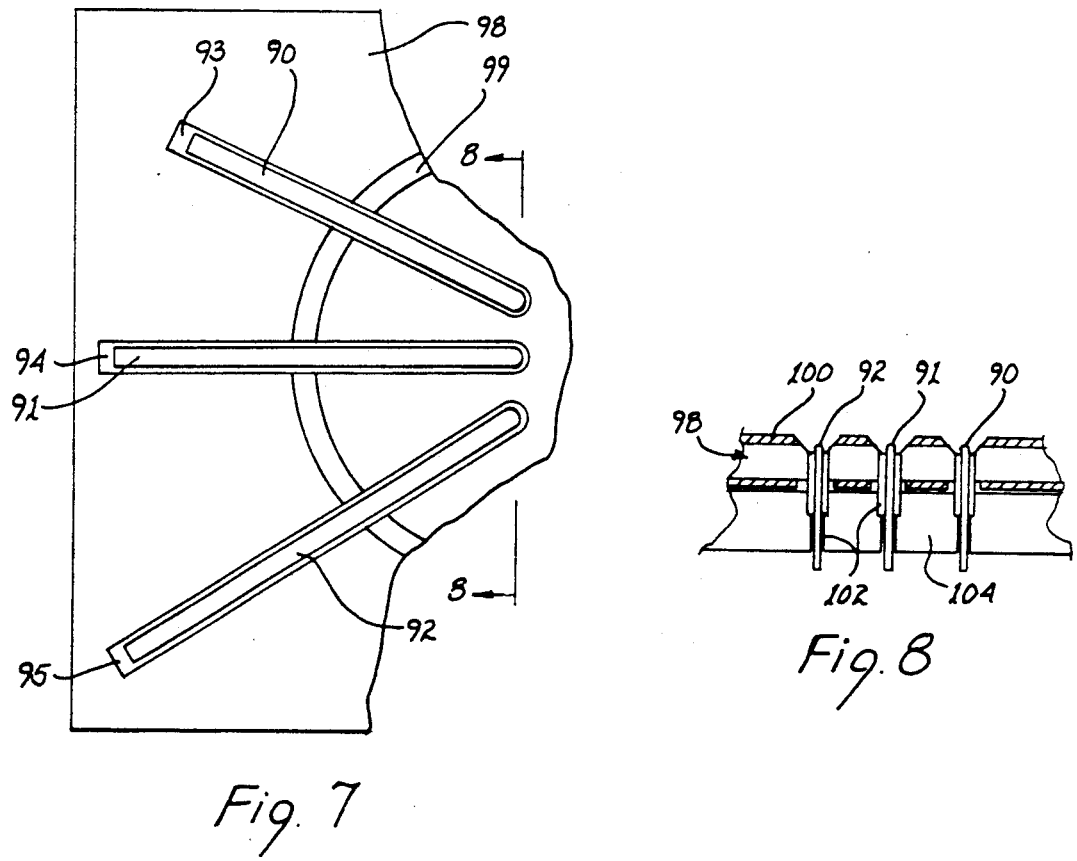
Fig. 7
Fig. 8

PROBE SYSTEM FOR DEVICE AND CIRCUIT TESTING

FIELD OF THE INVENTION

The present invention relates to the field of circuit testing systems, and more particularly to a system incorporating probes for making temporary electrical contact during the testing of circuits such as integrated circuits and the like.

BACKGROUND OF THE INVENTION

In the manufacture of integrated circuits, integrated circuit packaging, and hybrid circuits, it is necessary to test the circuits as part of the manufacturing process. The testing is performed by creating a temporary electrical contact between a test probe or probes with selected points on the circuit under test. A predetermined programmed test is then undertaken utilizing signals applied to the circuit and derived therefrom through the probes. Because of the complexity and the small size of the circuits, particularly extremely compact integrated circuits, the numbers of contacts that must be made with the circuit for appropriate testing demands strict control over the positioning of contact probes; further, the force with which the probes are placed against the predetermined circuit pads or points is extremely important. Controlling the precise positioning of the probes as well as the force on each probe demands extreme accuracy in the manufacture of probe systems.

In the prior art, such probe systems have typically used probes, which are normally in the form of very fine needles, that are individually attached to a printed circuit card by either soldering the probe directly to the printed circuit board or to a holding device which in turn is soldered to the printed circuit card. It has been suggested in the prior art that a blade such as the type described in U.S. Pat. No. 4,161,692 be secured to a printed circuit card with needles or probes attached to the end of the blade. The probes typically extend from the mounting place such as the blade in a cantilever arm fashion reaching out as much as several hundred mils to the point on the circuit, the pad, to be probed. To change the force on the probe requires either changing the probe diameter to make the probe stiffer or more flexible, or changing the probe length or cantilever length. Further, the utilization of such probes does not provide a convenient means for implementing a controlled impedance transmission line; that is, in many high frequency test environments, the use of transmission line techniques is very important for the accuracy and validity of the test.

Prior art probes that are cantilevered, or extend any significant distance from a supporting surface, are relatively free to drift; that is, they can become misaligned and will no longer contact the desired pad on the device for test. If the circuit to be tested contains contact pads that are in a single plane, it is possible for prior art probes to drift out of planarity such that the force existing between a given probe and its corresponding contact pad may be significantly greater or lesser than a probe and its corresponding pad at a different location on the circuit under test. Further, using such prior art techniques, it is very difficult to probe pads that are on different planes on the device being tested; for example, in some hybrid circuit conformations, it is possible to have pads or signal runs or traces that are difficult to properly contact using probe technologies of the prior art.

A further difficulty with prior art probe systems, relates to the means by which the probes are connected to the probe mounting card or circuit board. The connection of the probe is usually made by soldering the probe directly to the printed circuit board. The soldering process requires the use of flux which is frequently difficult to remove and can cause electrical leakage problems when the system is in use. This problem is greatly exacerbated in those instances where very high probe density is required. In the event a probe or probes become damaged, it is desirable to repair the probe rather than discard the entire assembly. However, removal and replacement of probes in such an environment becomes extremely difficult, time consuming, and very expensive.

OBJECTS OF THE INVENTION

It is therefore an object of the present invention to provide a probe assembly wherein the individual probes can be readily be removed and replaced.

It is another object of the present invention to provide a probe assembly wherein the probes are secured in appropriate electrical contact to their respective signal traces without the use of solder.

It is still another object of the present invention to provide a probe assembly that exhibits significantly less drift than probe assemblies of the prior art.

It is still another object of the present invention to provide a probe assembly that may be utilized in high frequency applications through the utilization of controlled impedance transmission line techniques.

It is still another object of the present invention to provide a probe assembly that can be adapted to extremely high density applications without sacrificing control over probe force.

It is still another object of the present invention to provide a probe assembly wherein a predetermined amount of scrubbing action may be obtained by all or selected ones of the probes in the assembly.

These and other objects of the present invention will become apparent to those skilled in the art as the description thereof proceeds.

SUMMARY OF THE INVENTION

Briefly, in accordance with one of the chosen embodiments of the invention, a probe system is provided wherein each of the probes is formed of a suitable metal and bent into an approximate 90° angle with one end thereof intended for contacting the circuit under test and the other end for communication with the remainder of the probe assembly. The portion of the probe for extension into contact with the circuit under test is guided through a probe guide having holes slightly larger in diameter than the probe to provide necessary lateral support to the probe while nevertheless permitting easy longitudinal movement of the probe in the hole. The portion of the probe provided for connection to remaining circuitry on the probe assembly provides a supported length that is nested in a groove provided therefor in the probe guide. This groove or slot in the probe guide terminates at the hole to receive the depending portion of the probe; thus, the probe rests within the slot provided in the probe guide with the depending portion of the probe extending through the hole and outwardly of the opposite side of the guide.

A pressure plate is provided for mounting on top of the probe guide to maintain the probe in position within its slot; to provide biasing force to the probe to permit it to be urged into contact with a circuit under test an elastomer pad or button is positioned between the pressure plate and the probe guide. Thus, when the pressure plate is secured to the probe guide, the elastomer forces the probe into the hole provided therefor in the probe guide while permitting limited upward movement of the probe within the hole against the force of compression of the elastomer. The pressure plate may include provision for electrical contact to the supported length of the probe. In one embodiment, the supported length of the probe is urged into contact with a conductive path provided from the face of the pressure plate facing the supported length of probe to the opposite face of the pressure plate. This conductive path may take numerous forms such as a metal ball contacting the probe and simultaneously contacting a plated-through hole provided in the pressure plate. A spring force urging the probe into contact with the metal ball is provided by a layer of elastomer material positioned beneath the supported length of the probe urging the probe against the metal ball.

To permit the utilization of the probe assembly of the present invention in higher frequency environments without adversely affecting test accuracy or validity, the pressure plate may be formed from a sheet of rigid material such as a printed circuit card having a buried ground plane positioned close to the supported length of the probe to form a transmission line.

BRIEF DESCRIPTION OF THE DRAWINGS

The present invention may more readily be described by reference to the accompanying drawings in which:

FIG. 1 is an exploded cross-sectional view of one embodiment of the present invention.

FIG. 2 is an illustration of the embodiment of FIG. 1 showing the apparatus of FIG. 1 in assembled form.

FIG. 3 is a partially exploded view of another embodiment of the probe assembly of the present invention.

FIG. 4 is a preferred embodiment of the probe assembly of the present invention shown in partially exploded cross-sectional view.

FIG. 5 is a modification of the embodiment of FIG. 4.

FIG. 6 is a partial cross-sectional view of FIG. 5 taken along lines 6—6.

FIG. 7 is a top view of a portion of a probe assembly constructed in accordance with the teachings of the present invention.

FIG. 8 is a partial cross-sectional view of FIG. 7 taken along lines 8—8.

DETAILED DESCRIPTION OF THE INVENTION

Figure 9:
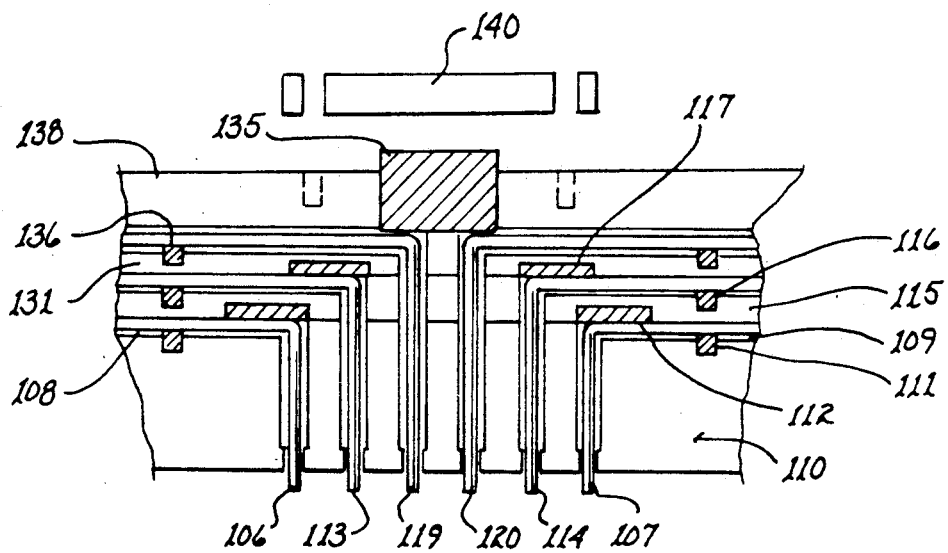
FIG. 9 is a cross-sectional view of a portion of a probe assembly constructed in accordance with the teachings of the present invention showing an embodiment useful when greater probe density is desired.

Referring now to FIGS. 1 and 2, a probe assembly constructed in accordance with the teachings of the present invention is shown. A probe 10 is formed of suitable metal such as tungsten, beryllium copper, or proprietary alloys available on the market. The probes are preferably cylindrical, although non-circular cross-sections may be used. The probe is bent at a substantially 90° angle in a very tight bending radius to form a supported length 11 and a depending portion 12. The probe tip 13 is intended to contact an appropriate point on the circuit to be tested. Most circuits to be tested by the apparatus of the present invention, such as integrated circuit chips, characteristically utilize predetermined contact points or "pads" which are provided for electrical connection to the circuitry contained on the chip. The probe tip 13 is intended to contact such circuit pads.

A probe guide is formed of a suitable rigid plastic material and is drilled to form a hole 16 to accept the depending portion 12 of the probe. The hole may have other than a circular cross-section; any non-circular cross-section must however provide the necessary supporting function for the probe extending therethrough. The hole is provided with two diameters; the portion of the hole at the top 17 is substantially larger than the diameter of the probe to permit the probe to seat properly without interference at the bend portion of the probe. The lower smaller diameter portion 18 of the hole is only slightly larger than the diameter of the probe to thereby provide lateral support to the probe while permitting free vertical movement within the hole. The holes may conveniently be formed by drilling a small diameter hole and then counterboring the hole to a desired depth. The probe guide is milled to form a groove or slot 20 in the top surface thereof; the slot has a depth and width approximately equal to the diameter of the supported length 11 of the probe. When assembled, the supported length will lay in the slot 20 on top of the probe guide with the depending portion 12 extending through the hole 16. A small button of elastomer 21 is positioned within a recess provided therefor in the probe guide 15; when the supported length 11 of the probe is positioned within the slot 20 the probe will pass over the elastomer button 21, the latter urging the probe into contact in a manner to be described.

A pressure plate 23 is provided to be placed on top of the probe 10 and the probe guide 15; the pressure plate may perform functions other than providing a means for maintaining the probe in its slot. For example, in the embodiment shown in FIGS. 1 and 2, the pressure plate is formed of an epoxy-glass printed circuit card having a buried ground plane 24 therein. A plated-through hole 25 is provided for the transfer of signals from the bottom to the topside of the pressure plate 23. A small metal ball 26 is positioned on the bottom of the plate 23 in contact with the plated-through hole 25. A recess 27 is formed in the bottom of the plate 23 to receive a second elastomer button 28.

When assembled, the supported length 11 of the probe rests within the slot 20 with the depending portion 12 of the probe extending through the hole 16. The metal ball 26 rests upon the top of the supported length 11 and contact between the two is assured by the spring force of the elastomer button 21 urging the supported length 11 of the probe into contact with the metal ball 26 and the metal ball into contact with the plated-through hole 25. The second elastomer button 28 contacts the probe 10 immediately above the depending portion 12 to provide a spring force directed vertically urging the probe to extend outwardly of the bottom of the probe guide 15 into contact with a circuit pad. The buried ground plane 24, in conjunction with the supported length 11 of the probe forms a controlled impedance transmission line to provide shielding and signal integrity to the signals communicating the length of the probe.

The respective elements of the assembly shown in FIGS. 1 and 2 may be clamped in any convenient fashion such as by screws (not shown) appropriately insulated from active signal paths. In the event of damage to the probe tip, or to any other portion of the probe, the apparatus may readily be disassembled, the damaged probe removed and replaced, and the apparatus reassembled.

Referring now to FIG. 3, another embodiment of the present invention is shown incorporating the utilization of a conventional printed circuit card having a layer of metal 31 on the bottom side thereof. A sheet of elastomeric material 32 is applied over the metal layer and into a recess 33 provided therefor in the circuit card 30. The thickness of the elastomer sheet 32 is selected to provide a predetermined controlled impedance, for example 50 ohms, between the ground plane formed by the layer of metal 31 and conductors 34 formed on the elastomer. The conductors 34 form a signal run for conducting signals from the probes to a desired location on the probe assembly for communication with external test equipment. The probes 36 and 37 are positioned within a probe guide 38 in a manner described previously in connection with FIGS. 1 and 2.

The supported lengths 41 and 40 of the probes 36 and 37, respectively, make contact with appropriate conductors 34 when the elements of FIG. 3 are assembled. Signals conducted by the probes 36 and 37 are carried by their corresponding conductors 34 and may be carried to other portions of the probe assembly for communication to an external test system; specific signal paths from the conductors 34 are not shown in FIG. 3 although it will be evident to those skilled in the art that connections to the conductors 34 can be made in numerous ways including transmission of the signal through plated through holes strategically located in the circuit card 30. The elastomer within the recess 33 provides a spring force for urging the respective probes downwardly to extend below the probe guide 38. The increased depth of the elastomer material within the recess 33 permits the probes 36 and 37 to be "overdriven" a greater depth than if the only elastomer provided were the thin sheet as shown at 32. The term "overdriven" refers to the depression of a probe within its probe guide a distance greater than a predetermined design distance. The ability to permit overdriven probes enables the assembly to accommodate uneven pad elevation, or circuit vertical positioning, while providing proper probe force against the pad and avoiding probe or circuit damage. The elements of the assembly may be secured by clamping with a suitable bolt extending through the bolt holes 39 provided in the printed circuit card 30 and the probe guide 38. In the embodiment of FIG. 3, the circuit card 30 provides the function of a pressure plate while also providing appropriate signal runs and shielding. The embodiment, as in the embodiments described previously, requires no solder for assembly and permits the use of controlled transmission line techniques close to the pad or signal run on the circuit under test; further, in those applications wherein the pads are difficult to reach and would otherwise require relatively long probes, the embodiment of FIG. 3 permits the probe guide 38 to be configured to support the depending portions of the probes for significant lengths while nevertheless not interfering with circuit components or the configuration of the circuit under test.

Referring to FIG. 4, a preferred embodiment of the probe assembly of the present invention is shown. In the embodiment shown in FIG. 4, the printed circuit board 42 is provided with two buried ground planes 43 and 44 as well as two selectively removable layers of metal 45 and 46. Thus, using conventional techniques, signal runs or paths can be created on both top and bottom surfaces of the circuit board 42. A hole 48 is created in the board 42 to accommodate an elastomer button 50.

A probe guide 52 is provided with slots 53 and 54 to accommodate the supported lengths of probes 56 and 57, respectively. Holes 60 and 61 communicate with the slots 53 and 54 in a manner described above in connection with the previous figures. While the illustration of FIG. 4 is two-dimensional, it will be appreciated by those skilled in the art that the probe assembly of the present invention is three-dimensional and that the probe guide 52 may be formed into a disk shape with the supported lengths of the probes 56 and 57 extending generally radially inward the edge of the ring-shaped probe guide 52. An annular groove 62 is provided in the top face of the guide 52 to accept an elastomeric ring 63. The ring 63 exerts an upward force on the supported lengths of the probes 56 and 57 to force them into intimate contact with selected signal runs provided by the metal layer 45 of the circuit board 42.

The printed circuit board 42 may act as a pressure plate; however, when an elastomer button of the size shown at 50 is utilized, a supplemental plate 67 may be added by attaching the plate to the circuit board 42 with screws. With the supplemental plate 67 thus attached, the circuit board 42 effectively becomes a pressure plate. Alternatively, the elastomer button 50 may be positioned within a recess provided in the circuit board 42 to obviate the necessity of the supplemental plate 67.

When the elements of FIG. 4 are clamped together, the elastomer 50 will be forced against the top of the probes 56 and 57 forcing them outwardly of the holes 60 and 61 to protrude from the bottom surface of the probe guide 52 to contact pads of the circuit under test. The elastomer ring 63 will exert an upward pressure against the supported lengths of the probes 56 and 57 to force the probes into contact with corresponding circuit paths or signal traces on the bottom surface of the circuit board 42. The signal traversing a signal trace on the bottom surface of the board 42 may be transmitted to the upper surface for further handling through the utilization of plated-through holes such as that shown at 64. The assembly of FIG. 4 thus provides a readily disassemblable probe assembly having controlled impedance signal paths using ground planes in the printed circuit board near both the top and bottom surfaces thereof. No solder is used in the assembly, and the elements may be separated to retrieve and replace a damaged probe.

FIG. 5 is a further modification of the structure of FIG. 4 utilizing further shielding and control of the signal path impedance. Referring to FIG. 5, a buried ground plane 70 is shown within the printed circuit board 71; the probe 73 is forced into intimate contact with the signal run 74 positioned on the bottom surface of the board 71 by the elastomeric ring 75. However, in the embodiment shown in FIG. 5, the probe guide 76 is formed having a double sided laminate (copper-dielectric-copper) 78 attached to its top surface and forming a part thereof. The slots such as the slot 80 for the supported length of the probe 73 is formed in and machined from the top layer of the laminate 78 (best seen in the cross-section of FIG. 6); the laminate 78 is shown having its upper copper layer 82 and dielectric core 83 milled to provide the slot 80 for the probe 73.

It may be seen by reference to FIGS. 5 and 6 that a controlled impedance transmission line is provided for the probe from the bend throughout the supported length thereof. If it is necessary to provide a controlled impedance transmission line for the depending portion of the probe, the probe guide 76 could be made of conductive material with suitable dielectric coating on the surfaces of the holes therein to electrically insulate the depending portion of the probe from the conductive probe guide. A structure of the latter nature would provide electrical shielding of the probe and provide a controlled impedance signal path throughout the entire length of the probe.

Referring to FIG. 7, a portion of a probe assembly is shown; the figure is useful for explaining further advantages of probe assemblies constructed in accordance with the teachings of the present invention. In FIG. 7, probes 90, 91 and 92 are positioned within their respective slots 93, 94 and 95. The probe guide 98 is formed with a double sided laminate (copper-dielectric-copper) in a manner similar to that described in connection with FIGS. 5 and 6. A ring 99 is milled into the laminate 98 to accommodate an elastomeric ring similar to that described in connection with FIG. 4. Referring now to FIG. 8, it may be seen that the laminate 98 is provided with a copper layer 100 on the top and a similar layer 101 on the bottom. These layers have been machined or etched from the vicinity of holes 102 provided in the laminate and the underlying probe guide material 104. It may be seen that the probes are separated by ground planes formed by the remaining copper laminate on the top and bottom of the laminate 98. Thus, there exist interstitial grounds between adjacent probe signal paths; these interstitial grounds form part of the controlled impedance signal path and provide improved electrical isolation of adjacent probes and signal paths.

While the use of buried ground planes to form controlled impedance transmission lines is helpful in some high frequency environments to provide shielding and signal integrity, a more complete shielding technique for use in the present invention is the use of coaxial conductors formed into probes. Thus, the probes described above may be constructed using coaxial shielded cable supported by a probe guide and extending through a hole therein with the central conductor of the coaxial cable forming the contact point for contacting the pad of a circuit under test. Elastomeric buttons or rings are used, in a manner described above, to provide force to urge the coaxial probes into the probe guide holes and into contact with the circuit being tested.

Referring to FIG. 9, a schematic representation of a portion of the probe assembly of the present invention is shown to facilitate the description of a multi-layering feature of the invention. In those instances requiring extremely high probe density, the probe assembly of the present invention permits close probe spacing without the many disadvantages described above in connection with the background of the invention. However, even greater density may be achieved through layering of probe assemblies. For example, referring to FIG. 9, a three layer probe assembly is shown wherein two probes are available from each level. Probes 106 and 107 are positioned in slots 108 and 109, respectively, in probe guide 110. The supported length of each of the probes is biased into contact with a corresponding circuit path or trace by an elastomeric ring 111 in a manner similar to that described in connection with the embodiment shown in FIG. 4. Downward biasing force is provided for the probes 106 and 107 through elastomeric ring 112. Layer 115 is a partial probe guide for probes 113 and 114 and may also provide support for appropriate circuit traces for probes 106 and 107. Biasing for the probes 113 and 114 is provided by elastomeric rings 116 and 117.

Probes 119 and 120 also pass through probe guide 112 and the intermediate layer 115 while also passing through holes provided in layer 131; suitable slots are provided in the layer 131 to accommodate the supported length of the probes 119 and 120 while elastomeric button 135 provides downward bias for the probes. An elastomeric ring 136 urges the supported lengths of probes 119 and 120 into contact with their respective circuit traces positioned on the bottom of circuit card 138. Pressure plate 140 may subsequently be secured such as by screws to compress elastomeric button 135. Alternatively, the circuit card 138 may act as the pressure plate if the elastomeric button 135 is placed within a recess in the card 138 in a manner similar to that described in connection with FIG. 1. The entire assembly can be clamped in any convenient manner such as by through-bolts (not shown).

It may be seen that in many instances the density of the probes can be limited by the necessity of providing appropriate signal paths to and from the probes while insuring appropriate isolation between signal paths such as by shielding and the like. Under extreme high probe density applications, the limiting parameters of the connecting circuitry to the probes may be alleviated through the utilization of multilayering technique wherein signal traces to individual probes can be accommodated at various levels of the probe assembly. Notwithstanding the extraordinary probe density achievable by multi-layering, it may be noted that the entire assembly may be disassembled for the removal and replacement of a damaged probe; no soldering is required and the time for probe replacement or repair is drastically reduced.

It may be possible to provide appropriate signal paths to and from the probes by incorporating signal traces on the probe guide. Thus, it may be possible to incorporate signal traces in the probe guides in such applications as the multi-layered embodiment of FIG. 9; further, the use of signal paths incorporated in the probe guide for communicating signals to and from the probes may be a convenient alternative to routing the signal from the probe through a circuit card or board acting as a pressure plate as shown in previous embodiments.

Figure 10:
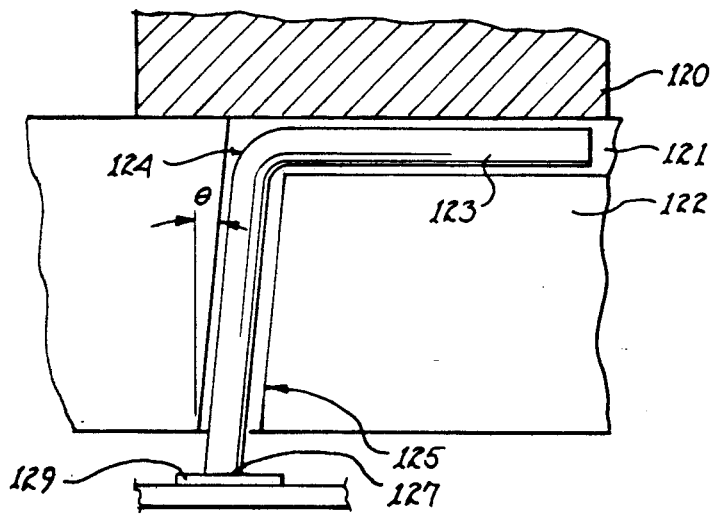
FIGS. 10 and 11 are sequential views of a portion of a probe assembly constructed in accordance with the teachings of the present invention showing a modification to achieve greater scrubbing action.
Figure 11:
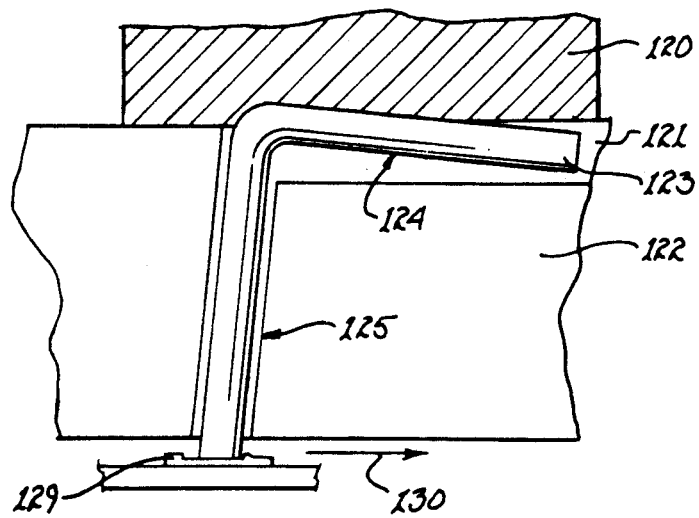

Referring to FIGS. 10 and 11, a modification of the probe assembly of the present invention is shown to provide greater scrubbing action of the probes when they contact a circuit pad. In many instances, it is desirable to create a wiping action between the probe and the pad to insure intimate contact and to remove any surface contaminates or films that may interfere with a solid, low impedance, contact. It is well known in general electrical circuitry that a wiping or scrubbing action between closing contacts will assist in reducing contact impedance; however, in probe technology it frequently is difficult to obtain controlled scrubbing action without endangering the life expectancy of the probe or damaging the probe and/or the pad.

The present invention provides a probe assembly that can be slightly modified to implement a scrubbing technique while avoiding most of the dangers of uncontrolled scrubbing action used in prior art systems. Referring to FIG. 10, a portion of the probe assembly of the present invention is shown wherein it may be seen that the elastomeric block 120 is positioned over a slot or groove 121 formed in the probe guide 122. The horizontal supported length 123 of the probe 124 is positioned within the slot 121 in a manner described in connection with the previous embodiments. The hole 125 provided in the probe guide 122 is inclined or "tilted" from vertical at an angle $\theta$ that is in the range of approximately 2° to as much as 45°. The particular angle chosen will depend on several factors including the scrubbing force desired and the type of pad being contacted. For typical integrated circuits, the preferred angle is 7°. However, in testing applications for packaged electronics devices such as dual in-line packages, the preferred angle may be close to 45°. The probe 124 may or may not be bent at an angle of 90° as described above in connection with previous figures. It is possible that the probe may be bent less than 90° to coincide with the angular modification of the hole 125. Further, while the hole 125 shown in FIGS. 10 and 11 is a single diameter hole, it will be understood that multiple diameters may be used in a manner similar to those described above. The tip of the probe 127 contacts the upper surface of a pad 129 to which it is to make electrical contact.

Referring to FIG. 11, the elements corresponding to FIG. 10 have like reference numerals. It may be seen by reference to FIG. 11 that the probe assembly has been moved downwardly forcing the probe 124 upwardly into the elastomeric material 120 thus creating a greater downward force on the probe and creating more forceful contact between the probe tip 127 and the pad 129. However, as a result of the angular displacement of the hole 125, downward movement of the assembly forces the probe tip 127 to move to the right, as indicated by the arrow 130, as it is being firmly forced against the surface of the pad 129. This scrubbing or scratching action between the probe tip 27 and surface of the pad 129 will permit the probe tip to penetrate through any surface contaminates or layers on the pad such as oxides, processing residues, etc. As the assembly is raised to the position of that shown in FIG. 10, the probe 124 returns to its original position.

While the invention has been described with reference to several particular embodiments thereof, those skilled in the art will be able to make various modifications to the described embodiments of the invention without departing from the true spirit and scope of the invention.

What is claimed is:

1. In a probe assembly for use in testing electrical circuits, the improvement comprising:
    (a) a plurality of probes, each having a bend therein to form a supported length and a depending portion, said depending portion extending downwardly from said supported length for making temporary electrical contact with a predetermined location on an electrical circuit to be tested;
    (b) a probe guide for supporting said probes, said guide having a plurality of slots each for receiving the supported length of a different one of said probes, and having a plurality of holes each aligned with a different one of said slots for receiving a depending portion of a probe supported by said one of said slots;
    (c) a first elastomeric means positioned within a recess provided therefor in said probe guide for contacting the supported lengths of said probes and urging them upwardly into contact with corresponding signal traces;
    (d) a pressure plate having an upper and a lower surface, said lower surface including a plurality of signal traces each corresponding to a different one of said probes and positioned over the supported length of a corresponding probe for making electrical contact therewith;
    (e) means contacting a signal trace on said lower surface to conduct signals on said signal trace to the upper surface of said pressure plate; and
    (f) second elastomeric means positioned between said pressure plate and said probe guide, contacting said probes and urging the depending portions thereof into said holes.

2. The combination set forth in claim 1 wherein said pressure plate is formed from a double sided laminate having copper layers on the top and bottom thereof separated by a dielectric layer.

3. The combination set forth in claim 1 wherein said means contacting a signal trace on said lower surface to conduct signals on said signal trace to the top surface of said pressure plate is a plated-through hole.

4. The combination set forth in claim 1 wherein said pressure plate includes a buried ground plane to form a controlled impedance transmission line in combination with the supported length of said probes.

5. The combination set forth in claim 1 wherein said second elastomeric means is positioned in a recess provided therefor in said pressure plate.

6. The combination set forth in claim 1 wherein each of said holes includes a plurality of diameters, the largest of which is positioned at the intersection of said hole and a corresponding slot and the smallest of which is on a side of the probe guide remote from said slot to guide a probe in said hole and provide lateral support thereto.

7. The combination set forth in claim 1 wherein said holes are counterbored with the larger diameter counterbored portion positioned at the intersection of said hole and a corresponding slot.

* * * * *